(12) United States Patent
Ouchi

(10) Patent No.: US 6,835,959 B2
(45) Date of Patent: Dec. 28, 2004

(54) SEMICONDUCTOR DEVICE, AND METHOD FOR MANUFACTURING THE SAME

(75) Inventor: Toshihiko Ouchi, Kanagawa (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/400,658

(22) Filed: Mar. 28, 2003

(65) Prior Publication Data
US 2003/0201446 A1 Oct. 30, 2003

(30) Foreign Application Priority Data
Apr. 25, 2002 (JP) .................................. 2002-123810

(51) Int. Cl.⁷ ................................................ H01L 27/15
(52) U.S. Cl. ........................ 257/79; 257/13; 257/85; 257/94; 257/98; 257/103
(58) Field of Search .................. 257/13, 79, 80, 257/89, 93, 98, 99, 103, 918

(56) References Cited

U.S. PATENT DOCUMENTS 5,696,023 A * 12/1997 Holonyak et al. .......... 438/767
6,368,889 B1 * 4/2002 Suemasu ...................... 438/22
6,697,403 B2 * 2/2004 Lee et al. ...................... 372/43

FOREIGN PATENT DOCUMENTS

JP  2000-312055  11/2000

OTHER PUBLICATIONS

"A silicon iron/disilicide light–emitting diode operating at a wavelength of 1.5 μm," De L ong, et al., Nature, vol. 387, Jun. 12, 1997, pp. 686–688.
"Native–oxide defined ring contact for low threshold vertical–cavity lasers," D. L. Huffak r, t al., Appl. Phys. Lett. 65 (1), Jul. 4, 1994, pp. 97–99.

* cited by examiner

Primary Examiner—Long Pham
Assistant Examiner—Wai-Sing Louie
(74) Attorney, Agent, or Firm—Fitzpatrick, Cella, Harper & Scinto

(57) ABSTRACT

The present invention provides a semiconductor device including an element that is considered to have less environmental problem (for example iron), and a method for manufacturing the same. More specifically, in a semiconductor device having multiple layers, at least one of the layers includes iron silicide. At least part of the layer including iron silicide is subjected to oxidation processing.

10 Claims, 10 Drawing Sheets

SEMICONDUCTOR DEVICE, AND METHOD FOR MANUFACTURING THE SAME

BACKGROUND OF THE INVENTION

1. Field of the Invention

The present invention relates to a semiconductor device, and more particularly, to a light emitting device, such as a light emitting diode, a laser diode or the like, made of a semiconductor material, or a photosensing device, such as a pin photodiode or the like. The invention also relates to an optoelectronic integrated circuit in which such a light emitting device and/or a photosensing device, and an electronic device are integrated on the same substrate.

2. Description of the Related Art

Devices that perform high-efficiency light emission by current injection, and high-efficiency photosensing devices are being practically used mainly using III-V compound semiconductors, such as AlGaAs/GaAs compounds, InGaAsP/InP compounds and the like. Particularly, as for infrared light emitting/photosensing devices, devices for optical communication using an optical fiber, and for optical interconnection for high-speed signal wiring between electronic apparatuses or within an electronic apparatus are being developed.

However, since III-V semiconductors contain elements whose reverse on the earth is small, such as In and the like, and/or elements having strong toxicity, such as As and the like, it is intended to use such elements as small as possible from the viewpoint of environmental problems.

SUMMARY OF THE INVENTION

It is an object of the present invention to provide a semiconductor device that contains an element having little environmental problem (for example, Fe), and a method for manufacturing the same.

According to one aspect of the present invention, a semiconductor device having multiple layers includes at least one layer including iron silicide. At least part of the layer including iron silicide is subjected to oxidation processing.

In one embodiment, the layer including iron silicide is made of beta-iron disilicide and operates as an active layer of a light emitting device, and at least a partial region of the active layer operates as an insulating region by the oxidation processing.

In another embodiment, the layer including iron silicide operates as a light emitting device provided above and/or below an active layer, and at least a partial region of the layer including iron silicide operates as an insulating region by the oxidation processing.

In still another embodiment, the layer including iron silicide is made of beta-iron disilicide and constitutes a light absorbing layer in a photosensing device, and a partial region of the light absorbing layer operates as an insulating region by the oxidation processing.

In yet another embodiment, the layer including iron silicide operates as a photosensing device provided above and/or below a light absorbing layer, and at least a partial region of the layer including iron silicide operates as an insulating region by the oxidation processing.

In yet a further embodiment, the layer including iron silicide includes one of calcium, manganese, magnesium, barium, chromium, iridium, osmium, ruthenium and rhenium.

In still another embodiment, the layer including iron silicide is made of beta-iron disilicide.

In still another embodiment, the layer including iron silicide operates as a light emitting device provided near an active layer in which beta-iron disilicide fine particles are embedded within silicon, and at least part of the layer including iron silicide operates as an insulating region by the oxidation processing.

In still another embodiment, part of the multiple layers constitutes reflecting mirrors provided so as to sandwich an active layer, and light is output in at least one direction perpendicular to a plane where the multiple layers are formed.

In still another embodiment, the reflecting mirror comprises the layer including iron silicide.

In still another embodiment, part of the multiple layers is configured so as to sandwich an active layer to form clad layers including silicon, and light is output in at least one direction perpendicular to a plane where the multiple layers are formed.

In still another embodiment, part of the clad layer including silicon comprises the layer including iron silicide, and a region including iron oxide formed by the oxidation processing operates as a confining clad layer for a light guide channel in a lateral direction.

In still another embodiment, the layer including iron silicide is made of beta-iron disilicide and constitutes a light absorbing layer in a photosensing device, and a partial region of the light absorbing layer operates as an insulating region by the oxidation processing.

In still another embodiment, the layer including iron silicide operates as a photosensing device provided above and/or below a light absorbing layer, and at least a partial region of the layer including iron silicide operates as an insulating region by the oxidation processing.

In still another embodiment, the layer including iron silicide operates as a photosensing device provided near a light absorbing layer in which beta-iron disilicide fine particles are embedded within silicon, and at least part of the layer including iron silicide operates as an insulating region by the oxidation processing.

In still another embodiment, the oxidation processing is performed by supplying molecules or atoms for oxidizing the layer including iron silicide from side portions, to sequentially oxidize the layer including iron silicide from the side portions toward a center.

According to another aspect of the present invention, an integrated circuit includes the above-described semiconductor device and an electronic integrated circuit that are integrated on a same substrate.

According to still another aspect of the present invention, an optoelectronic integrated circuit includes a light emitting device, a photosensing device and an electronic integrated circuit that are integrated on a same silicon substrate in the above-described integrated circuit.

According to yet another aspect of the present invention, an electronic apparatus includes a module or a package incorporated therein, in which the above-described optoelectronic integrated circuit is mounted on an optoelectronic mounting board.

According to yet a further aspect of the present invention, a light transmission system includes the above-described optoelectronic integrated circuit incorporated therein. Information transmission is performed using an optical fiber.

According to still another aspect of the present invention, a light emitting device includes an active layer and clad layers. The active layer includes beta-iron disilicide that is oxidized at portions surrounding the active layer.

The foregoing and other objects, advantages and features of the present invention will become more apparent from the following description of the preferred embodiments taken in conjunction with the accompanying drawings.

DESCRIPTION OF THE PREFERRED EMBODIMENTS

A semiconductor device according to the present invention is characterized in that, as described above, it includes multiple films, at least one of the multiple layers includes iron silicide, and part of the layer containing iron silicide is subjected to oxidation processing. In the following description, when using the layer including iron silicide for a light-emitting device, the layer is used as an active layer, a clad layer or a mirror layer, and when using the layer including iron silicide for a photosensing device, the layer is used as a light absorbing layer.

(First Embodiment)

Figure 1:
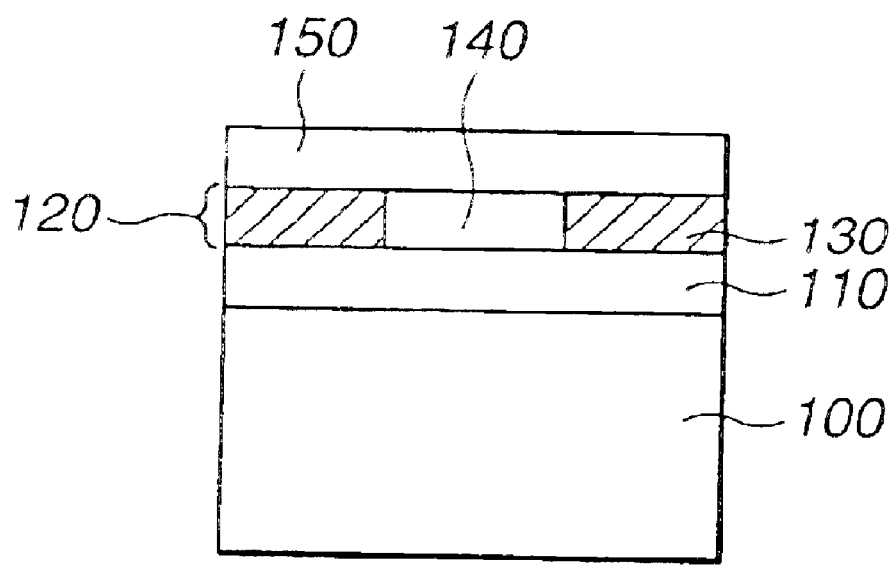
FIGS. 1 and 2 are cross-sectional views illustrating the present invention.

First, a case of using the layer including iron silicide as an active layer of a light emitting device will be described with reference to FIG. 1. In FIG. 1, there are shown a substrate 100, a lower clad layer 110, an iron-silicide layer (a beta-iron disilicide layer when operating as an active layer) 120, a region 130 where the iron-silicide layer is oxidized, an active layer 140, and an upper clad layer 150. In general, the terms of the upper and lower clad layers are used in the case of an edge emitting device. In the case of a surface light-emitting device, these layers are also termed upper and lower spacer layers for constituting a cavity. FIG. 1 schematically illustrates a light emitting device, in which electrodes and the like are omitted. When outputting a laser beam in a surface light emitting device, respective mirror layers are formed above the upper clad (or spacer) layer 150 and between the substrate 100 and the lower clad (spacer) layer 110.

In the first embodiment, since the portion surrounding the active region 140 including iron silicide becomes an insulating region (including at least iron silicide) by being subjected to oxidation processing, a current constriction structure in which current is selectively injected into the active region 140 is provided.

The use of beta-iron disilicide ($\beta$-FeSi$_2$) as a material for a light-emitting/photosensing device is described, for example, in Nature, June 1997, Vol. 387, p. 686–p. 688. The beta-iron disilicide is a direct-transition semiconductor. By providing a diode structure in which this layer is used as an active layer and is sandwiched between p-type Si and n-type Si, a light-emitting diode emitting light having a wavelength of 1.5 $\mu$m is obtained. In the first embodiment, since a current constriction structure is realized, it is possible to reduce the threshold compared with other structures. Because of the wavelength of 1.5 $\mu$m, a low-loss optical fiber can be used. Accordingly, such a light-emitting diode is optimum as a light source for optical communication. When using this diode as a light source for optical interconnection, since the operational voltage can be set to about 1 V (because the band-gap voltage is as low as 0.85 V), matching with a low-voltage Si IC (integrated circuit) is excellent, so that low power consumption can be realized. Accordingly, beta-iron disilicide is a promising material.

Figure 10:
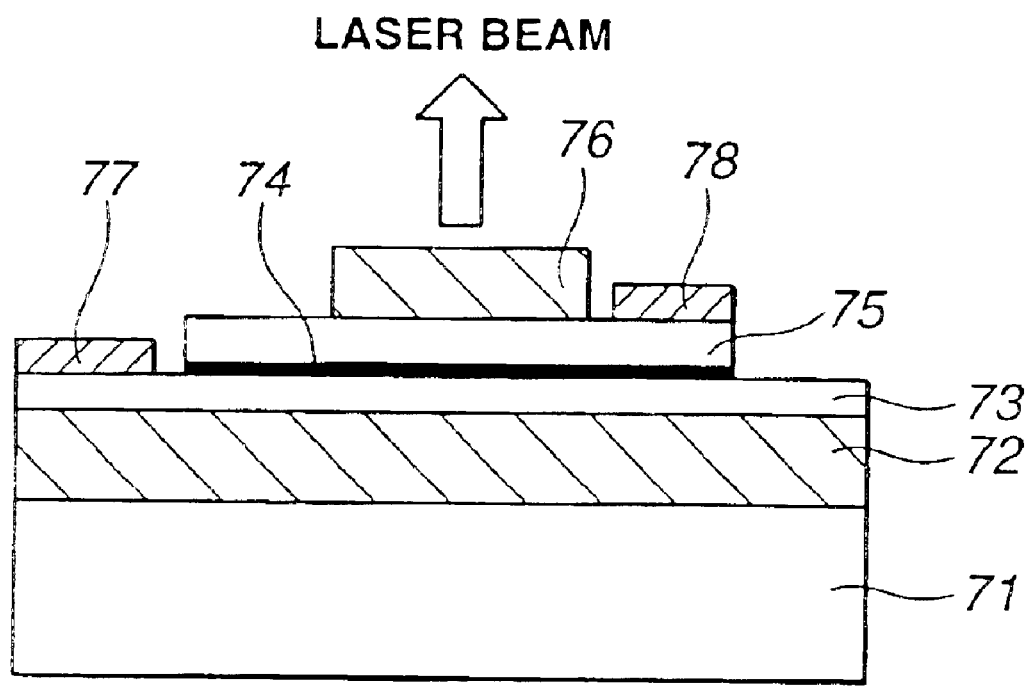
FIG. 10 is a schematic cross-sectional view illustrating a conventional structure.

As a semiconductor laser utilizing beta-iron disilicide ($\beta$-FeSi$_2$), a surface light emitting laser as shown in FIG. 10 is disclosed (Japanese Patent Application Laid-Open (Kokai) No. 2000-312055 (2000)). FIG. 10 illustrates a structure in which a beta-iron disilicide active layer 74 is sandwiched between clad layers 73 and 75, and reflecting mirrors 72 and 76, respectively, and light is emitted in a direction perpendicular to the substrate. In the first embodiment, an outer circumferential portion of the active layer 74 is subjected to oxidation processing, so that side walls of the active layer 74 is not exposed to air. Accordingly, an increase in the threshold current due to a leak current caused by non-emission recombination does not occur. Furthermore, since it is unnecessary to reduce the size of the light emitting region by etching in order to reduce the threshold, an increase in the production cost caused by required improved accuracy in etching does not occur.

In the first embodiment, by utilizing the fact that iron is easily oxidized, an insulating layer including Fe$_x$O$_y$ (iron oxide) is formed by oxidizing iron silicide in lateral directions using, for example, high-temperature water vapor, to constrict the current injection region and avoid contact with air at side walls of the active layer and the influence of interfaces damaged by etching. The oxidation processing may be performed in a liquid or in air. A mask or the like may be used if necessary. HCl, Cl$_2$ or the like may also be used together.

Figure 3A:
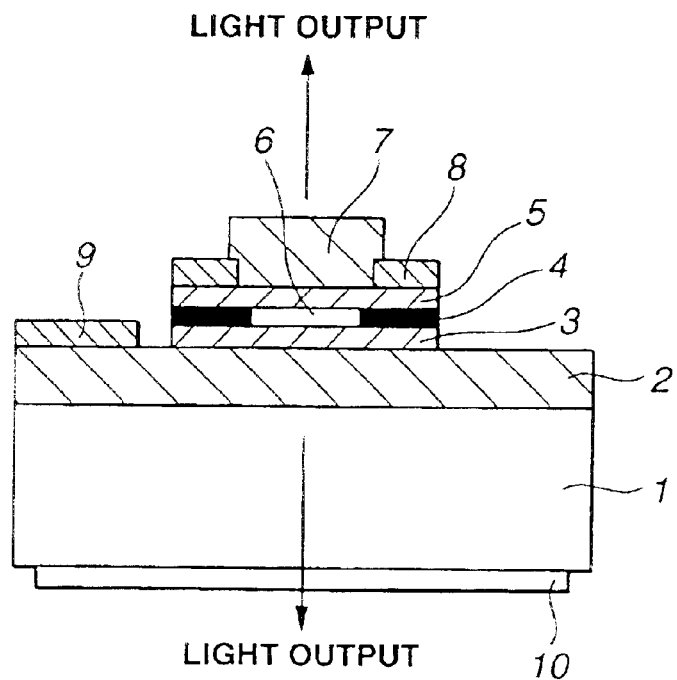
FIGS. 3A and 3B are a schematic cross-sectional view and a plan view, respectively, illustrating a light emitting device in Example 1 of the present invention.
Figure 3B:
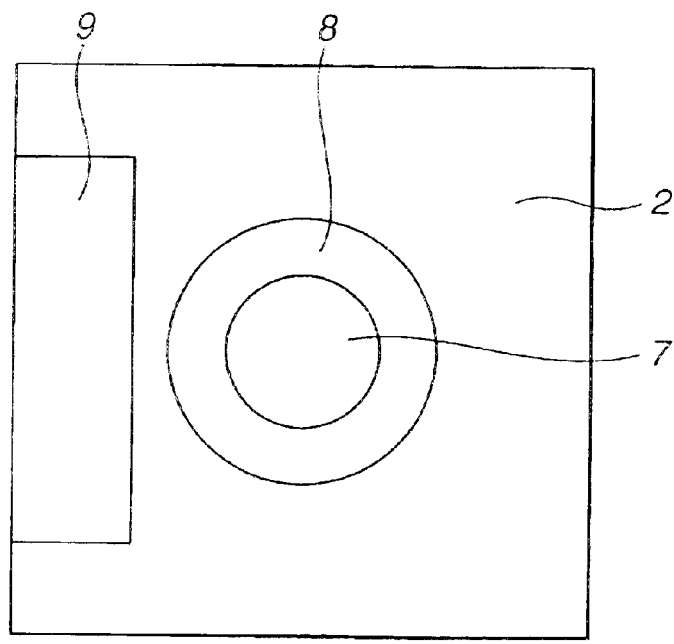

FIGS. 3A and 3B illustrate a specific example of the above-described structure (to be described later in detail). Carriers can be injected only into a region 6 made of beta-iron disilicide, serving as an active layer. A region 4 is an insulating layer made by oxidizing beta-iron disilicide.

A technique of performing such oxidation in an AlAs laser or the like is disclosed, for example, in Applied Physics Letters, July 1994, Vol. 65, p. 97–p. 99. Since AlAs is an indirect-transition semiconductor, it cannot be used for a light emitting layer. Accordingly, it is necessary to form an oxide layer after forming an AlAs layer near an active layer made of a different material. For that purpose, it is necessary to shorten the distance from the active layer to the AlAs layer, resulting in a small degree of freedom in design. On the other hand, as described above, in the case of using iron silicide, since the light emitting layer itself can be an oxidized layer, it is possible to perform efficient current constriction and widen the degree of freedom in design.

Figure 5:
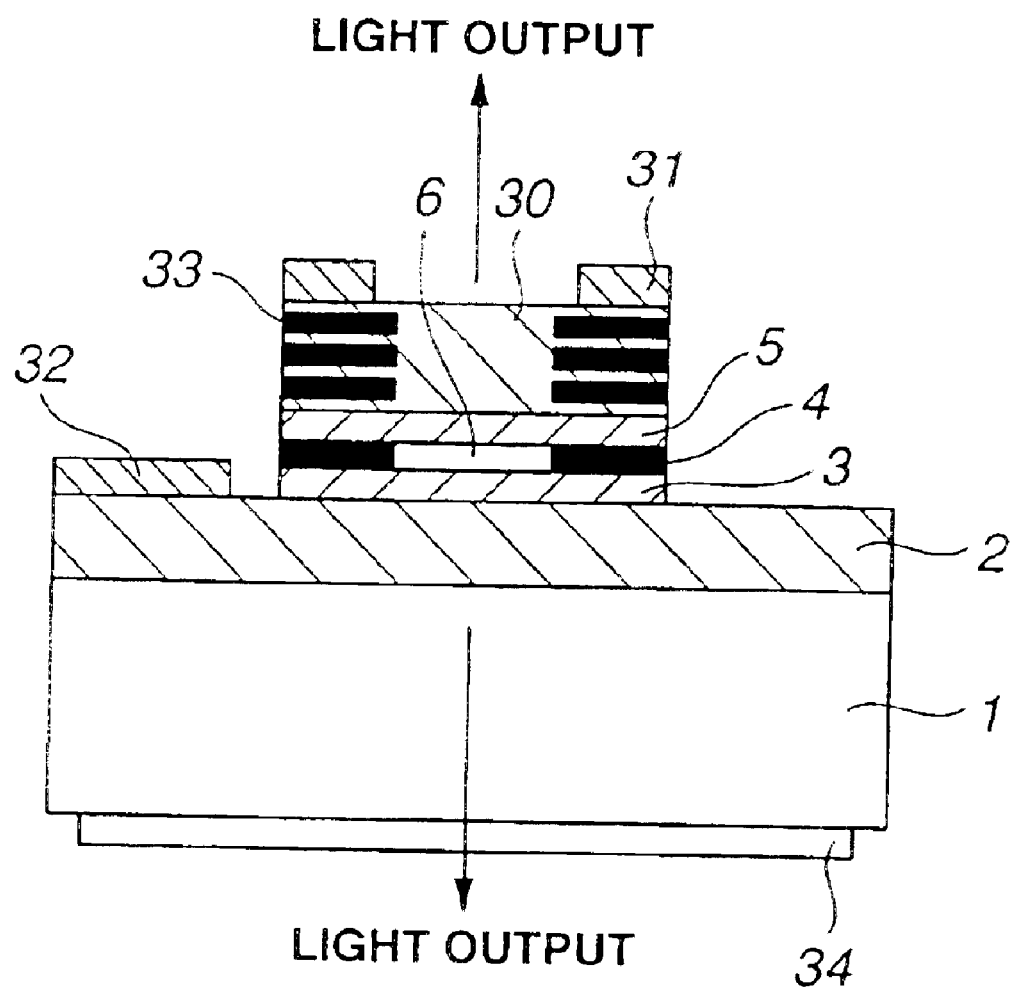
FIG. 5 is schematic cross-sectional view illustrating a light-emitting device in Example 2 of the present invention.

In the present invention, in addition to the light-emitting layer, a light guide channel may be formed by oxidizing a layer including iron silicide (see FIG. 5). This layer may be made of another phase (an alpha phase or a gamma phase) of iron silicide, or may also include any other element capable of providing a silicide semiconductor, such as calcium, magnesium, barium, chromium, iridium, osmium, ruthenium, rhenium or the like.

By thus forming a current constriction layer or a light guide channel by oxidizing a layer containing iron silicide, it is possible to provide a low-threshold, high-reliability and high-efficiency surface light emitting laser, edge emitting laser, or a high-efficiency light emitting diode or photodiode with a low cost.

Since such a light emitting/photosensing device can be directly formed on a Si substrate, it is also possible to provide an optoeletronic integrated circuit, in which such a device and an electronic integrated circuit are integrated on the same substrate, with a small size and a low cost. By using such an optoelectronic integrated circuit, it is possible to provide an optoelectronic module or package capable of performing high-speed processing by performing high-density mounting, and to provide a portable small-size next-generation high-speed electronic apparatus in which such a module or package is mounted. Furthermore, it is possible to construct a small-size and low-cost light transmission system by applying such an apparatus to a light transmission apparatus.

In the first embodiment, light emitting devices have been mainly described. When using the device of the first embodiment as a photosensing device, the active layer operates as a light absorbing layer. When providing a photodiode, the presence of a leak current causes degradation in the characteristics, such as a decrease in the efficiency, an increase in the dark current, and the like. In the first embodiment, however, such problems are mitigated because side walls of the light absorbing layer is subjected to oxidation processing.

(Second Embodiment)

Figure 2:
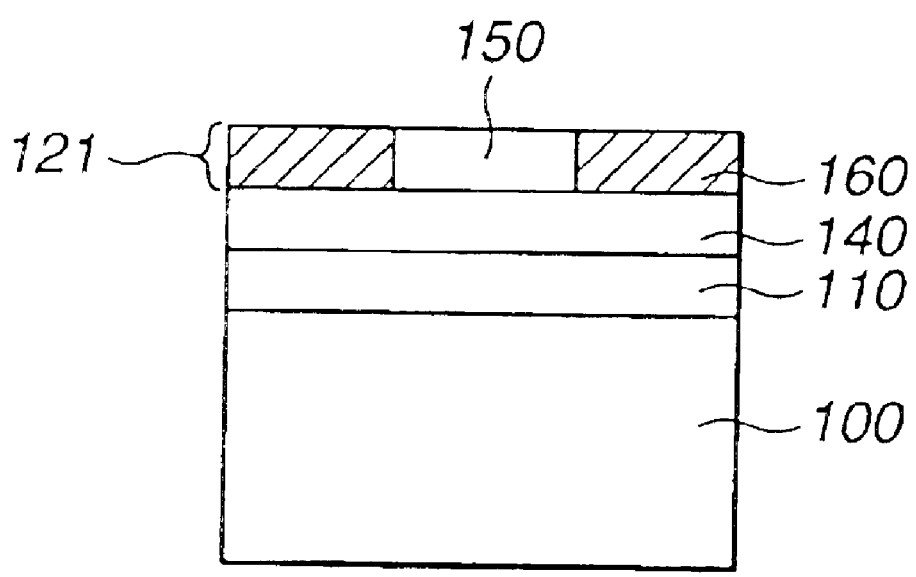
Figure 6:
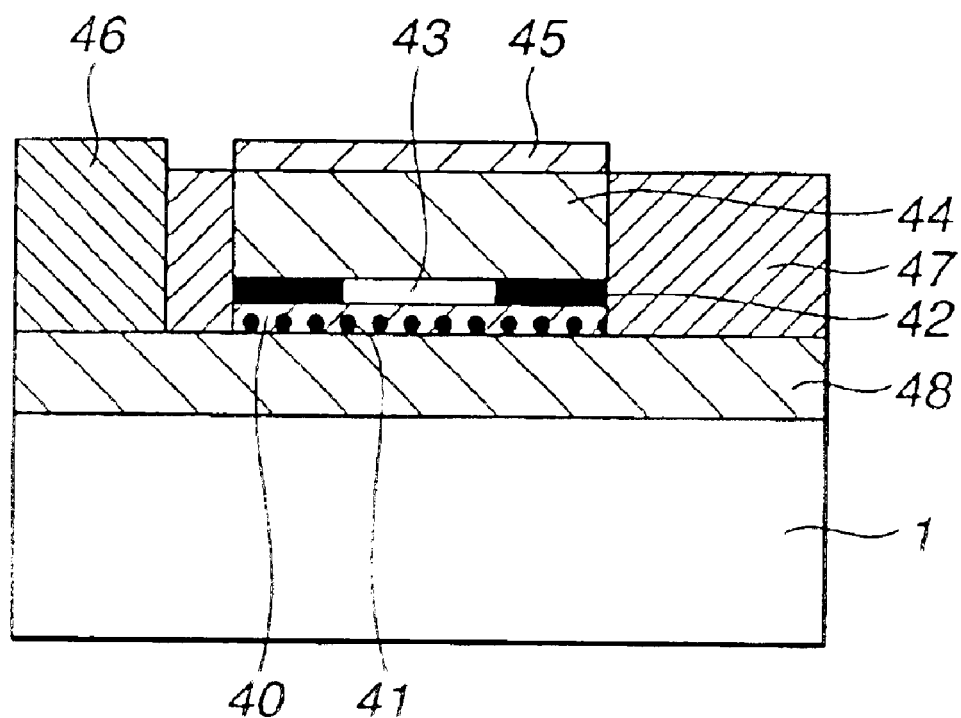
FIG. 6 is schematic cross-sectional view illustrating a light emitting device in Example 3 of the present invention.

Next, a case of using the layer including iron silicide as a clad (spacer) layer of a light emitting device, according to a second embodiment of the present invention, will be described with reference to FIG. 2. In FIG. 2, there are shown a substrate 100, a lower clad (spacer) layer 110, an active layer 140, an iron-silicide layer 121, and an upper clad (spacer) layer 150. An insulating region 160 is obtained by oxidizing the layer including iron silicide. In FIG. 2, electrodes and the like are omitted. In the second embodiment, a current constriction structure is realized by performing oxidation processing of an outer circumferential portion of the clad (spacer) layer. Although in FIG. 2, the entire outer circumferential portion of the clad layer is subjected to oxidation processing, a configuration in which only part of the clad layer is oxidized in the direction of the thickness (for example, as shown in FIG. 6) may also be adopted.

(Third Embodiment)

Figure 9:
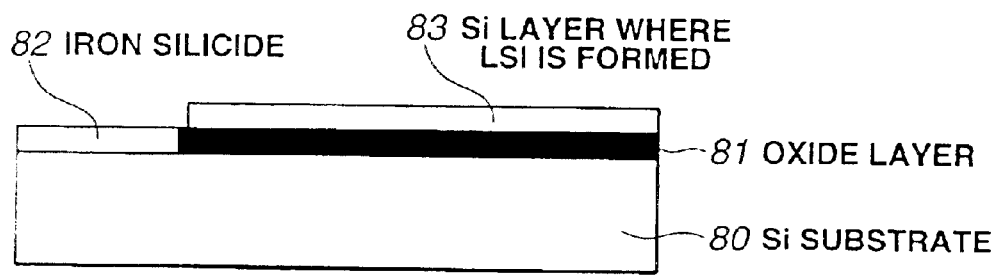
FIG. 9 is a cross-sectional view illustrating the present invention.

In a third embodiment of the present invention, a description will be provided of a structure in which an LSI (large-scale integrated circuit) region and an optical-device region are integrated on a Si substrate. In FIG. 9, there are shown a Si substrate 80, an insulating region 81 formed by oxidizing an iron-silicide layer, an iron-silicide-layer region 82 (in which, for example, the optical device described in any one of the forgoing embodiments is formed), and a Si layer 83 in which an LSI is formed. The insulating region 81 is used for insulation with respect to the substrate 80.

In order to drive this light-emitting/photosensing device, an electronic device made of Si is required. In order to achieve, for example, reduction in the size and the production cost, and high-speed driving as a result of proximity arrangement, it is an important task to integrate this Si device and a compound-semiconductor device.

Since the lattice constant differs between two types of semiconductors, it is generally difficult to form a III-V semiconductor film having excellent characteristics on a Si substrate. However, as will be described in the following examples, by using an iron-silicide layer having only a small lattice mismatch with a Si substrate (about 1%), it is possible to integrate an optical device and an electronic device on the same substrate.

EXAMPLES

Specific examples of semiconductor devices according to the present invention will now be described. Each of Examples 1-3 represents a single light emitting device, Example 4 represents a case in which such a device is applied to optical interconnection, and Example 5 represents a case in which such a device is applied to a light transmission apparatus.

Example 1

FIGS. 3A and 3B are a cross-sectional view and a plan view, respectively, of a surface light emitting laser in Example 1. In this laser, a lower reflecting mirror 2, a lower spacer layer 3, an active layer 6, an oxide layer 4 for constricting the current injection region in the active layer 6, an upper spacer layer 5, and an upper reflecting mirror 7 are successively formed on a Si substrate 1. Current is injected into the active layer 6 via an upper electrode 8 and a lower electrode 9, to emit laser beams in vertical directions. As shown in FIG. 3B, the upper electrode 8 has the shape of a ring in order to provide a circular aperture. However, the upper electrode 8 may have the shape of an ellipse, a quadrangle, or any other polygon. When integrating the laser with another device, electric wires (not shown) from the electrodes 8 and 9 to the other device may be formed after forming an insulating layer on the lower reflecting mirror 2.

The details of the respective layers will now be described. Usually, an undoped Si substrate is used as the Si substrate 1. However, when intending to get the lower electrode from the back of the Si substrate 1, an n-type Si substrate or a p-type Si substrate may also be used. A Si/Ca$_x$Fe$_y$Si epitaxial multilayer film was used as the lower reflecting mirror 2. Ca$_x$Fe$_y$Si is obtained by mixing a very small amount of Ca in iron silicide. Since the energy band gap of calcium silicide is about 1.9 eV, it is possible to reduce light absorption at the wavelength of about 1.5 $\mu$m of emission from the active layer 6 by widening the band gap compared with iron silicide. Since the refractive index of Ca$_x$Fe$_y$Si is about 5 (differs depending on the amount of mixture of Ca) in contrast to the refractive index of Si of about 3.5, this layer can operate as a distributed Bragg reflector (DBR) by forming a multilayer structure having a thickness of $\lambda/4$. An n-Si layer having an impurity concentration of $1 \times 10^{18}$ cm$^{-3}$ was used as the uppermost layer in order to provide contact with the lower electrode 9 and to perform carrier injection into the active layer 6.

A lower portion and a portion close to the active layer 6 of the lower spacer layer 3 were an n-Si layer having an impurity concentration of $1 \times 10^{18}$ cm$^{-3}$, and an undoped layer, respectively. Then, the active layer 6 made of undoped beta-iron disilicide was formed. Then, the upper spacer layer 5, in which a portion close to the active layer 6 is undoped and an upper portion is made of p-Si having an impurity concentration of $1 \times 10^{18}$ cm$^{-3}$, was formed. The oxide layer 4, serving as an insulating layer, is a mixed layer of iron oxide and silicon oxide obtained by oxidizing beta-iron disilicide. The oxide layer 4 is mostly made of iron oxide $Fe_xO_y$, depending on the method of oxidation. As will be described later, this layer was formed by oxidizing the layer 6 originally made of beta-iron disilicide in lateral directions from side walls of a mesa. Hence, the oxide layer 4 has the shape of a ring, so that current can flow only in a central aperture. This aperture sometimes has the shape of a polygon, such as a quadrangle or the like, because face-orientation dependency appears depending on conditions and the width of oxidation. The upper reflecting mirror 7 was made of multiple films of $Si/SiO_2$. The upper electrode 8 was made of AuGa in order to provide p contact. The lower electrode 9 was made of AuSb in order to provide n contact. Thus, ohmic electrodes were obtained.

In this device, since laser oscillation having a wavelength of 1.55 $\mu$m is obtained, the laser beam can travel through the Si substrate 1. Hence, light beams can be emitted in upper and lower directions perpendicular to the substrate 1. Since a multiple resonator is formed due to reflection at the back of the Si substrate 1, an AR (antireflection) film 10 is formed if necessary. Since it is only necessary to prevent reflection of light, surface roughening, coating of a light absorber, or the like may be performed when it is unnecessary to obtain light from the back of the substrate 1.

The reflectance of each of the upper and lower mirrors may be set depending on the situation. That is, if it is intended to obtain light beams from both surfaces, a reflectance of about 99.9% may be provided symmetrically to both of the mirrors. If it is intended to obtain a light beam from one of the surfaces, the reflectance may be asymmetrical such that a surface from which a light beam is obtained has a reflectance of 99.7% and the opposite surface has a reflectance of 99.99%. Thus, a low threshold and high output power of the light beam can be realized.

Figure 4A:
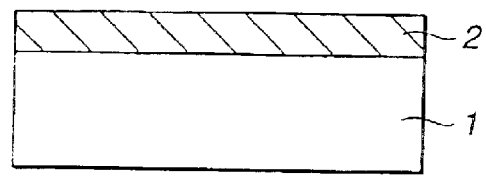
FIGS. 4A–4E are cross-sectional views illustrating a process for manufacturing the light emitting device shown in FIGS. 3A and 3B.

Next, the manufacturing process will be described with reference to FIGS. 4A–4E. In FIG. 4A, a $Si/Ca_xFe_ySi$ multilayer film, serving as the lower reflecting mirror 2, was formed on the Si substrate 1 according to MOCVD (metal organic chemical vapor deposition). Alternatively, MBE (molecular beam epitaxy), RDE (reactive deposition epitaxy), LPE (liquid phase epitaxy), hydride CVD may also be used. Fe/Ca ion implantation may also be used together. As described above, the uppermost layer is made of n-type Si.

Figure 4B:
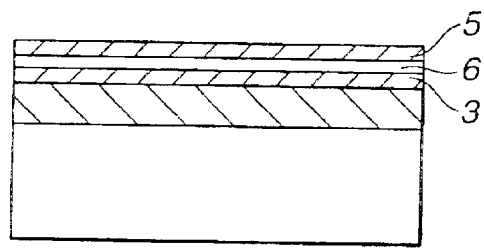

In FIG. 4B, a Si layer, serving as the lower spacer layer 3, a beta-iron disilicide layer, serving as the active layer 6, and a Si layer, serving as the upper spacer layer 5 were sequentially deposited on the lower reflecting mirror 2 according to similar deposition methods. Sb and B were doped for the n-type Si layer and the p-type Si layer, respectively. Thereafter, in order to improve the crystallinity of beta-iron disilicide, annealing at a high temperature (about 900° C.) may be performed if necessary.

Figure 4C:
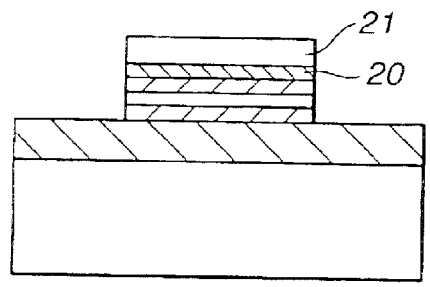

In FIG. 4C, after forming a dielectric material 20, such as $SiO_2$ or the like, and a resist pattern 21 in the form of a circle having a diameter of 30 $\mu$m according to photolithography and etching, a mesa was formed by exposing the n-Si layer according to dry etching.

Figure 4D:
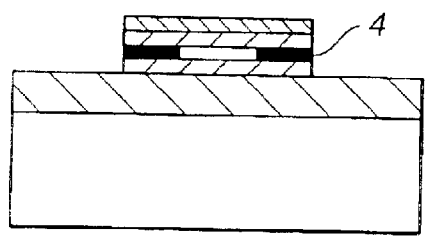

In FIG. 4D, after removing the resist 21, a current constriction structure having a diameter of 5 $\mu$m was formed while controlling the time by performing selective oxidation of beta-iron disilicide at 500° C. in a water-vapor atmosphere using the $SiO_2$ as a mask. Water vapor was supplied, for example, by performing bubbling of nitrogen with a flow rate of 3 l/min in water within a mantle heater maintained at 90° C. Water vapor may also be supplied by vaporizing water using a vaporizer. The oxidation temperature and the flow rate are set to appropriate values depending on the state of the crystal. A HCl gas or a $Cl_2$ gas may be used together if necessary. At that time, although Si is also oxidized, the rate of oxidation is lower than that of iron silicide.

Figure 4E:
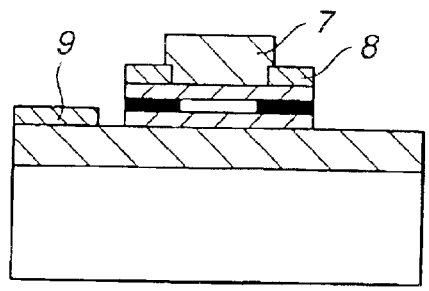

In FIG. 4E, after removing the dielectric material, serving as a mask, the electrodes 8 and 9 were formed. Then, the $Si/SiO_2$ multilayer film 7 was formed according to RF (radio frequency) magnetron sputtering. The patterning was also performed according to a lift-off method.

Although in the configuration of the mirror in Example 1, the semiconductor $Si/Ca_xFe_ySi$ multilayer film formed on the Si substrate is used as the lower reflecting mirror 2, any other appropriate configuration may also be adopted provided that light absorption at a wavelength of 1.5 $\mu$m is small. Furthermore, a $Si/SiO_2$ multilayer film in which a dielectric material is used instead of a semiconductor may also be adopted. Such a configuration may be achieved by repeating formation of $SiO_2$ by thermal oxidation of the surface of Si and transfer of a Si thin film. In a simpler approach, after forming a $Si/SiO_2$ multilayer film according to sputtering, an n-Si single-crystal layer may be transferred onto $SiO_2$. Anyway, it is desirable that the uppermost layer of the lower reflecting mirror 2 is a single-crystal thin film in order to perform epitaxial growth of the active layer 6.

In the surface light emitting laser of Example 1, since the active layer itself is constricted by a stable oxide compared with the conventional structure, it is possible to provide a laser having excellent emission efficiency in which the oscillation threshold can be reduced and long-term reliability can be obtained.

Example 2

In Example 2 of the present invention, as shown in FIG. 5, a $Si/Ca_xFe_ySi$ multilayer film 30 was also used as the upper reflecting mirror. In oxidation processing of the active layer, $Ca_xFe_ySi$ layers of the mirror were partially oxidized to provide layers 33. Since the refractive index is reduced to about 3 by oxidation, the light guide structure is simultaneously formed, to further reduce the threshold and stabilize the oscillation mode. In this structure, an upper electrode 31 was formed above the uppermost layer of the semiconductor multilayer mirror doped to provide a p-type semiconductor.

By thus forming all layers according to epitaxial growth, the number of manufacturing processes can be reduced to realize a low cost.

Although in Example 2, only part of the mirror was oxidized, the mirror may be entirely oxidized to form an oxide film/Si multilayer mirror.

Although in the above-described examples, a laser structure having reflecting mirrors at upper and lower portions has been illustrated, a light emitting diode having a reflecting mirror provided only at one surface or having no reflecting mirror may also be provided. A mesa-type pin photodiode may also be provided with a similar structure having mirrors or no mirrors.

Example 3

In the above-described examples, a thin film made of beta-iron disilicide is used as the active layer. In Example 3, as shown in FIG. 6, an active layer is made of microcrystals or quantum dots providing a stereoscopic dot structure 41.

Microcrystals may be formed by forming a film according to RDE, followed by annealing to cause natural coagulation.

In FIG. 6, reference numeral 40 represents an undoped Si layer in which coagulated beta-iron disilicide dots are embedded in Si. Although in FIG. 6, dots are arranged in one layer, dots may also be arranged in multiple layers. Oxidation does not proceed in lateral directions in this dot layer. Accordingly, a current constriction structure is provided such that injected carriers are controlled by an aperture 43 constricted by an oxide layer 42. The aperture 43 may be formed using beta-iron disilicide as described in Example 1 or 2. Alternatively, a $Ca_xFe_ySi$ layer that does not operate as a light emitting layer, or alpha-iron silicide may also be used.

A surface light emitting laser as in the above-described examples may be manufactured by forming a current constriction structure by performing selective oxidation in a layer different from a light emitting layer. In Example 3, however, a case of applying the technique to an edge emitting laser will be described.

In FIG. 6, an n-type Si lower clad layer 48, an active layer in which microcrystalline beta-iron disilicide 41 is embedded in undoped Si 40, a current constriction aperture 43, an insulating oxide layer 42, and a p-type Si upper clad layer 44 are laminated on a Si substrate 1. Etching is performed to the depth of the active layer in the form of a stripe. A p-type electrode 45 is formed above the stripe. Polyimide 47 is embedded in side walls of the stripe to flatten the surface. The height of an n-type electrode 46 is adjusted to the height of the p-type electrode 45 according to plating or the like after providing contact with the lower clad layer 48.

In such an edge emission striped laser, it is also possible to achieve a low threshold and high emission efficiency by introducing an oxide layer near an active layer according to the present invention.

Example 4

Figure 7:
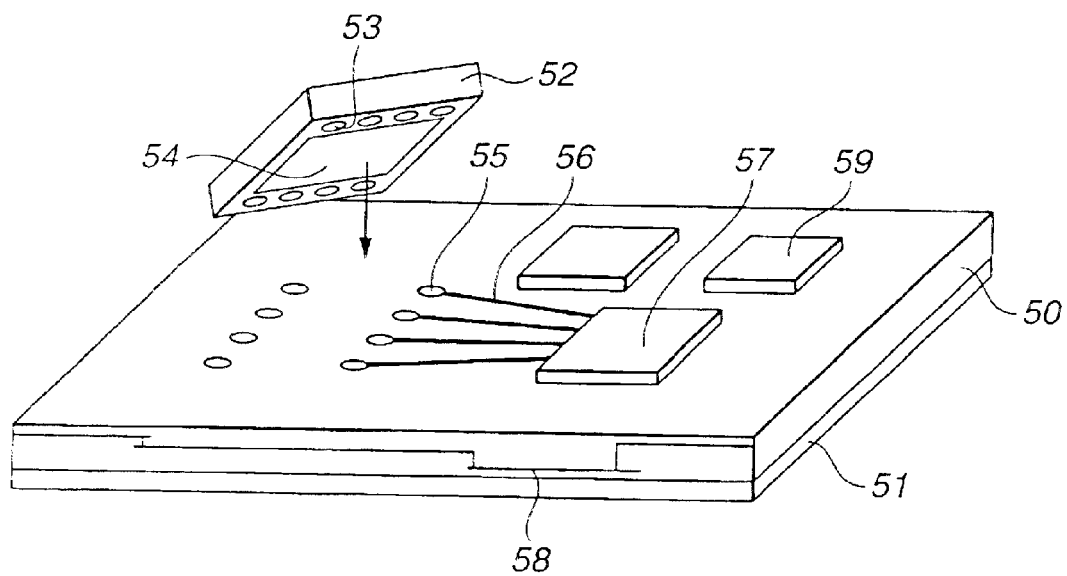
FIG. 7 is a diagram illustrating an optoelectronic integrated circuit in Example 4 of the present invention, and an optoelectronic mounting substrate that mounts the same.

In Example 4 of the present invention, the light emitting/photosensing device in one of the above-described examples is integrated as one chip with a Si integrated circuit, to be used as optical interconnection. FIG. 7 illustrates a schematic diagram of Example 4.

An electronic integrated circuit is formed in a region 54 on a Si bare chip. In order to optically connect part of a high-speed signal from the electronic integrated circuit to other chips, an optical I/O portion 53 is formed. On a light-emitting portion of the optical I/O portion 53, the light emitting device according to the present invention is integrated on the same Si substrate. Similarly, a pin photodiode made of beta-iron disilicide is also integrated in a photosensing portion.

Such a chip, serving as an optoelectronic integrated circuit, is mounted on an optoelectronic board on which light guide channels 56 and 51, and an electric wire layer 50 are integrated, and is subjected to optical connection with another chip 57 via optical input/output portions 55. Reference numeral 58 represents electric wires within the board. An electric chip 59 including only an electronic integrated circuit may also be mounted on the same board.

With such a configuration, a board or a system LSI in which different types of integrated circuits are integrated at high density and subjected to high-speed processing is provided. An element mounting a plurality of chips for realizing a function in the above-described manner is termed a multichip package (MCP), a multichip module (MCM) or the like.

Such an element in which different chips are mounted at high density is particularly suitable for high-speed signal processing of a small-size portable electronic apparatus.

Example 5

Figure 8A:
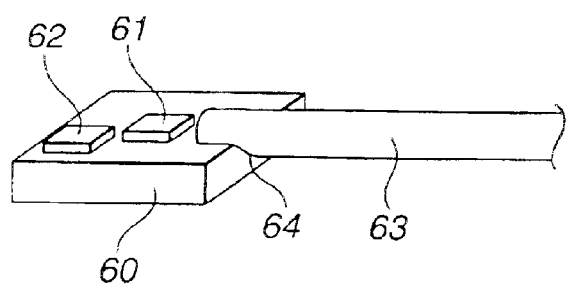
FIGS. 8A and 8B are diagrams illustrating a light transmission apparatus and a light transmission system, respectively, in Example 5 of the present invention.
Figure 8B:
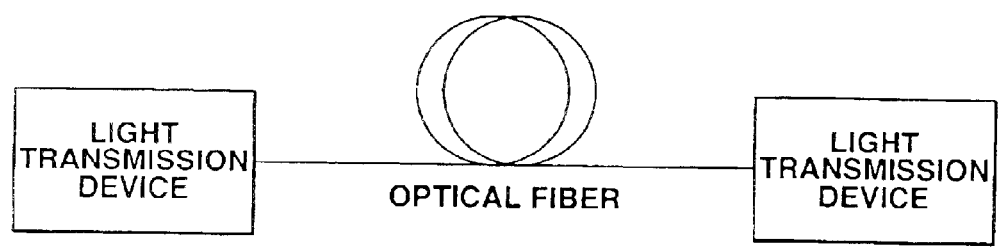

In Example 5 of the present invention, as shown in FIGS. 8A and 8B, the above-described element is used as a light transmission device. In FIG. 8A, a light-emitting device 61 having an active layer made of beta-iron disilicide, and a driving circuit 62 for the light emitting device are integrated on the same substrate. Connection between the light-emitting device 61 and an optical fiber 63 is fixed in a V groove formed in the same Si substrate by means of passive alignment. The situation is the same for a photosensing device. It is possible to provide an integrated photosensing/light emitting device by dividing a signal line from an optical fiber into two signal lines by providing a plane optical circuit formed by guide channels made of $SiO_2$ or the like on a Si chip, and connecting the two signal lines to corresponding ones of a light-emitting device and a photosensing device.

By using such optoelectronic chips as light transmission devices for optical fiber communication as shown in FIG. 8B, it is possible to provide an inexpensive and small-size light transmission system for a wavelength of 1.55 $\mu$m.

The individual components shown in outline or designated by blocks in the drawings are all well known in the semiconductor device arts and their specific construction and operation are not critical to the operation or the best mode for carrying out the invention.

While the present invention has been described with respect to what are presently considered to be the preferred embodiments, it is to be understood that the invention is not limited to the disclosed embodiments. To the contrary, the present invention is intended to cover various modifications and equivalent arrangements included within the spirit and scope of the appended claims. The scope of the following claims is to be accorded the broadest interpretation so as to encompass all such modifications and equivalent structures and functions.

What is claimed is:

1. A semiconductor device having multiple layers, said device comprising:

at least one layer including iron silicide, wherein at least part of said at least one layer including iron silicide is subjected to oxidation processing, wherein part of the multiple layers constitutes a plurality of reflecting mirrors provided so as to sandwich an active layer, wherein light is output in at least one direction perpendicular to a plane where the multiple layers are formed, and wherein a reflecting mirror of said plurality of reflecting mirrors comprises said at least one layer including iron silicide.

2. A semiconductor device according to claim 1, wherein said at least one layer including iron silicide includes iron oxide formed by the oxidation processing.

3. A semiconductor device according to claim 1, wherein said at least one layer including iron silicide includes at least one of calcium, manganese, magnesium, barium, chromium, iridium, osmium, ruthenium and rhenium.

4. A semiconductor device according to claim 1, wherein said at least one layer including iron silicide is made of beta-iron disilicide and operates as an active layer of a light emitting device, and wherein at least a partial region of the active layer operates as an insulating region by the oxidation processing.

5. A semiconductor device according to claim 1, wherein said at least one layer including iron silicide operates as a light emitting device provided above and/or below an active layer, and wherein at least a partial region of said at least one layer including iron silicide operates as an insulating region by the oxidation processing.

6. A semiconductor device according to claim 1, wherein said at least one layer including iron silicide operates as a light emitting device provided near an active layer, said active layer comprising microcrystalline beta-iron disilicide embedded within silicon, and wherein at least part of said at least one layer including iron disilicide operates as an insulating region by the oxidation processing.

7. A semiconductor device having multiple layers, said device comprising:

at least one layer including iron silicide, wherein at least part of said at least one layer including iron silicide is subjected to oxidation processing, wherein part of the multiple layers is configured so as to sandwich an active layer with a plurality of clad layers, each of which includes silicon, wherein light is output in at least one direction perpendicular to a plane where the multiple layers are formed, wherein part of a clad layer of said plurality of clad layers comprises said at least one layer including iron silicide, and wherein a region including iron oxide formed by the oxidation processing operates as a confining clad layer for a light guide channel in a lateral direction.

8. A semiconductor device having multiple layers, said device comprising:

at least one layer including iron silicide, wherein at least part of said at least one layer including iron silicide is subjected to oxidation processing, wherein said at least one layer including iron silicide is made of beta-iron disilicide and constitutes a light absorbing layer in a photosensing device, and wherein a partial region of the light absorbing layer operates as an insulating region by the oxidation processing.

9. A semiconductor device having multiple layers, said device comprising:

at least one layer including iron silicide, wherein at least part of said at least one layer including iron silicide is subjected to oxidation processing, wherein said at least one layer including iron silicide operates as a photosensing device provided above and/or below a light absorbing layer, and wherein at least a partial region of said at least one layer including iron silicide operates as an insulating region by the oxidation processing.

10. A semiconductor device having multiple layers, said device comprising:

at least one layer including iron silicide, wherein at least part of said at least one layer including iron silicide is subjected to oxidation processing, wherein said at least one layer including iron silicide operates as a photosensing device provided near a light absorbing layer, said light absorbing layer comprising microcrystalline beta-iron disilicide embedded within silicon, and wherein at least part of said at least one layer including iron silicide operates as an insulating region by the oxidation processing.

* * * * *

UNITED STATES PATENT AND TRADEMARK OFFICE
CERTIFICATE OF CORRECTION

PATENT NO.    : 6,835,959 B2
DATED         : December 28, 2004
INVENTOR(S)   : Toshihiko Ouchi It is certified that error appears in the above-identified patent and that said Letters Patent is hereby corrected as shown below:

<u>Title page,</u>
Item [56], References Cited, OTHER PUBLICATIONS, "De L ong, et al.," should read -- D. Leong, et al., --; and "D. L. Huffak r, t al.," should read -- D.L. Huffaker, et al., --.

<u>Column 2,</u>
Line 61, "According yet" should read -- According to yet --.

<u>Column 3,</u>
Lines 18 and 20, "schematic" should read -- a schematic --.

<u>Column 5,</u>
Line 35, "is subjected" should read -- are subjected --; and
Line 62, "forgoing" should read -- foregoing --.

Signed and Sealed this

Eleventh Day of October , 2005

JON W. DUDAS
*Director of the United States Patent and Trademark Office*